US012581863B2

(12) United States Patent
Wu et al.

(10) Patent No.: US 12,581,863 B2
(45) Date of Patent: Mar. 17, 2026

(54) MRAM FABRICATION AND DEVICE

(71) Applicant: Taiwan Semiconductor Manufacturing Co., Ltd., Hsinchu (TW)

(72) Inventors: Jung-Tang Wu, Kaohsiung (TW); Wu Meng Yu, Taichung (TW); Szu-Hua Wu, Zhubei (TW); Chin-Szu Lee, Taoyuan (TW); Han-Ting Tsai, Kaoshiung (TW); Yu-Jen Chien, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 404 days.

(21) Appl. No.: 18/447,383

(22) Filed: Aug. 10, 2023

(65) Prior Publication Data

US 2023/0389438 A1 Nov. 30, 2023

Related U.S. Application Data

(60) Continuation of application No. 17/461,132, filed on Aug. 30, 2021, now Pat. No. 11,864,467, which is a division of application No. 16/559,207, filed on Sep. 3, 2019, now Pat. No. 11,107,980.

(60) Provisional application No. 62/738,681, filed on Sep. 28, 2018.

(51) Int. Cl.
| | |
|---|---|
| *H10N 50/01* | (2023.01) |
| *G11C 11/16* | (2006.01) |
| *H01F 10/32* | (2006.01) |
| *H01F 41/34* | (2006.01) |
| *H10B 61/00* | (2023.01) |
| *H10N 50/80* | (2023.01) |

(52) U.S. Cl.
CPC .......... *H10N 50/01* (2023.02); *G11C 11/161* (2013.01); *H01F 10/3254* (2013.01); *H01F 41/34* (2013.01); *H10B 61/00* (2023.02); *H10N 50/80* (2023.02)

(58) Field of Classification Search
CPC ........ G11C 11/161; H10N 50/80; H01F 10/30
See application file for complete search history.

(56) References Cited

U.S. PATENT DOCUMENTS

| | | | |
|---|---|---|---|
| 8,593,854 | B1 | 11/2013 | Chih et al. |
| 8,869,436 | B2 | 10/2014 | Tsai et al. |
| 10,720,568 | B2 | 7/2020 | Sung et al. |
| 10,832,749 | B2 | 11/2020 | Kuo et al. |
| 2010/0102407 | A1* | 4/2010 | Kajiyama ............. H10B 61/22 257/E29.323 |
| 2010/0200900 | A1 | 8/2010 | Iwayama |

(Continued)

FOREIGN PATENT DOCUMENTS

| | | |
|---|---|---|
| CN | 107887393 A | 4/2018 |
| JP | 2010186869 A | 8/2010 |

(Continued)

*Primary Examiner* — Shih Tsun A Chou
(74) *Attorney, Agent, or Firm* — Slater Matsil, LLP

(57) ABSTRACT

A top electrode of a magnetoresistive random access memory (MRAM) device over a magnetic tunnel junction (MTJ) is formed using a film of titanium nitride oriented in a (111) crystal structure rather than a top electrode which uses tantalum, tantalum nitride, and/or a multilayer including tantalum and tantalum nitride.

20 Claims, 14 Drawing Sheets

(56)            References Cited

U.S. PATENT DOCUMENTS

| | | | |
|---|---|---|---|
| 2012/0001148 A1 | 1/2012 | Miller et al. | |
| 2013/0001652 A1 | 1/2013 | Yoshikawa et al. | |
| 2013/0234094 A1 | 9/2013 | Chang et al. | |
| 2013/0336041 A1 | 12/2013 | Tsai et al. | |
| 2014/0146593 A1 | 5/2014 | Tsai et al. | |
| 2014/0166961 A1 | 6/2014 | Liao et al. | |
| 2014/0175365 A1 | 6/2014 | Chang et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2015/0076437 A1* | 3/2015 | Tao ........................ | H10B 53/30 |
| | | | 257/4 |
| 2015/0137059 A1 | 5/2015 | Chen et al. | |
| 2016/0315251 A1 | 10/2016 | Nagase et al. | |
| 2017/0069837 A1 | 3/2017 | Choi et al. | |
| 2017/0244031 A1 | 8/2017 | Jeong et al. | |
| 2018/0097173 A1 | 4/2018 | Chuang et al. | |
| 2019/0019841 A1 | 1/2019 | Eeh et al. | |

FOREIGN PATENT DOCUMENTS

| | | | |
|---|---|---|---|
| KR | 20130007410 A | 1/2013 |
| KR | 20150056454 A | 5/2015 |
| TW | 201709579 A | 3/2017 |
| TW | 201727959 A | 8/2017 |
| TW | 201812915 A | 4/2018 |
| WO | 2010080542 A1 | 7/2010 |
| WO | 2016114900 A1 | 7/2016 |

\* cited by examiner

MRAM FABRICATION AND DEVICE

PRIORITY CLAIM AND CROSS-REFERENCE

This application is a continuation of U.S. application Ser. No. 17/461,132, filed Aug. 30, 2021, which is a divisional of U.S. application Ser. No. 16/559,207, filed Sep. 3, 2019, now U.S. Pat. No. 11,107,980 issued Aug. 31, 2021, which claims the benefit of U.S. Provisional Application No. 62/738,681, entitled "MRAM Fabrication and Device", filed on Sep. 28, 2018, each application is hereby incorporated herein by reference.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
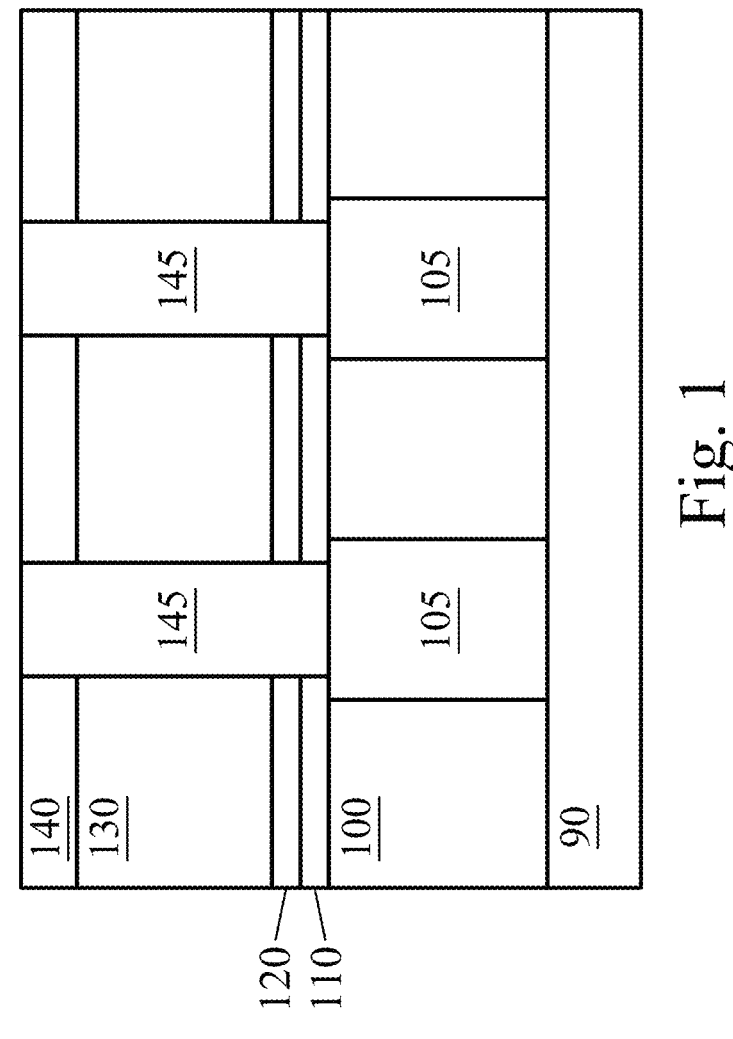
FIGS. 1 through 7 illustrate intermediate steps for a process flow for forming a magnetoresistive random access memory (MRAM) device, in accordance with some embodiments.
Figure 1:
Figure 1:

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In forming a magnetoresistive random access memory (MRAM) device, after the formation of the top electrode, subsequent processing steps include patterning the layers into individual cells. Oxidation of the top electrode and/or underlying layers during patterning may cause issues with the operation of the magneto tunnel junction (MTJ) of the MRAM cell. In particular, oxygen may inhibit electron spin in the MTJ and magnetic reversibility of the free layer of the MTJ. Embodiment processes use a deposition technique which results in a top electrode which reduces oxygen contamination which may result from subsequent processing. The crystal orientation of the top electrode reduces oxygen contamination of the underlying layers. For example, as described in greater detail below, a single layer top electrode made from titanium nitride may be used with a crystal orientation (face centered cubic) which is (111), thereby providing oxygen inhibiting properties for the underlying layers, including the free layer of the MTJ of the MRAM cell. Single layers of other materials or multi-layers of titanium nitride and other materials may also be used. Titanium nitride also has the advantage of having a relatively high oxidation temperature of greater than about 450° C. in these processes.

FIGS. 1 through 13 illustrate intermediate stages of the creation of an MRAM device 10. In FIG. 1, a substrate 90 is illustrated. In some embodiments, the substrate 90 may be a carrier substrate and the MRAM device 10 is formed on the carrier substrate. MRAM device 10 may include several MRAM cell areas, including MRAM cell 20 and MRAM cell 25. After each of the layers of the MRAM cells are made of the MRAM device 10, the cells are patterned into individual MRAM cells.

In some embodiments, the substrate 90 may be formed of a semiconductor material such as silicon, silicon germanium, or the like. In some embodiments, the substrate 90 is a crystalline semiconductor substrate such as a crystalline silicon substrate, a crystalline silicon carbon substrate, a crystalline silicon germanium substrate, a III-V compound semiconductor substrate, or the like. In an embodiment the substrate 90 may comprise bulk silicon, doped or undoped, or an active layer of a silicon-on-insulator (SOI) substrate. Generally, an SOI substrate comprises a layer of a semiconductor material such as silicon, germanium, silicon germanium, or combinations thereof, such as silicon germanium on insulator (SGOI). Other substrates that may be used include multi-layered substrates, gradient substrates, or hybrid orientation substrates.

In some embodiments, the substrate 90 may be a portion of an interconnect or a redistribution structure. The substrate 90 may be formed of an insulating material, such as a dielectric material. In some embodiments, the substrate 90 may include an Inter-Metal Dielectric (IMD) layer or an Inter-Layer Dielectric (ILD) layer, which may include a dielectric material having a low dielectric constant (k value) lower than 3.8, lower than about 3.0, or lower than about 2.5, for example, and conductive features formed therein. The insulating material of the substrate 90 may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), MethylSilsesQuioxane (MSQ), or the like.

Layer 100 is formed over the substrate 90. In some embodiments, the layer 100 may be formed of a semiconductor material such as silicon, silicon germanium, or the like. In some embodiments, the layer 100 is a crystalline semiconductor such as crystalline silicon, a crystalline silicon carbon, a crystalline silicon germanium, a III-V compound semiconductor, or the like. In an embodiment the layer 100 may comprise bulk silicon, doped or undoped, or an active layer of a silicon-on-insulator (SOI) substrate.

In some embodiments, the layer 100 may be a portion of an interconnect or a redistribution structure. The layer 100 may be formed of an insulating material, such as a dielectric material. In some embodiments, the layer 100 may include an Inter-Metal Dielectric (IMD) layer or an Inter-Layer Dielectric (ILD) layer, which may include a dielectric material having a low dielectric constant (k value) lower than 3.8, lower than about 3.0, or lower than about 2.5, for example, and conductive features, such as the conductive features 105. The insulating material of the layer 100 may be formed of PSG, BSG, BPSG, FSG, TEOS, Black Diamond (a registered trademark of Applied Materials Inc.), a carbon-containing low-k dielectric material, HSQ, MSQ, or the like.

The conductive features 105 may be coupled to an active or passive device (e.g., a transistor or other electrical component) which may be embedded in the substrate 90 or the layer 100. The conductive features 105 may include, for example, a source/drain region of a transistor, a gate electrode, a contact pad, a portion of a via, a portion of a metal line, and so forth. Active devices may comprise a wide variety of active devices such as transistors and the like and passive devices may comprise devices such as capacitors, resistors, inductors and the like that together may be used to generate the desired structural and functional parts of the design. The active devices and passive devices may be formed using any suitable methods either within or else on the substrate 90 or the layer 100.

The conductive features 105 formed in the layer 100 may include, for example, contacts or metal lines, which may be formed of copper or a copper alloy. In some embodiments the conductive features 105 may be a part of an interconnect to provide addressing to the MRAM cells which will be formed in the MRAM device 10. In such embodiments, the conductive features 105 may be a control line, such as a bit line or word line. In some embodiments, conductive features 105 may include other conductive materials such as tungsten, aluminum, or the like. Furthermore, conductive features 105 may be surrounded by a conductive diffusion barrier layer (not shown) formed underlying and encircling the conductive features 105. The conductive diffusion barrier layer may be formed of titanium, titanium nitride, tantalum, tantalum nitride, or the like.

The conductive features 105 may be formed by any suitable process. For example, by a patterning and plating process where openings corresponding to the conductive features 105 are made, the conductive diffusion barrier layer deposited in the openings (if used), followed by a seed layer. Next, the conductive features 105 are formed by any suitable process, such as a plating process including electro-plating or electroless-plating. Following the formation of the conductive features 105, any excess material along with the excess seed layer and conductive diffusion barrier layer may be removed by suitable etching and/or polishing process, such as by a chemical mechanical polishing (CMP) process. Other suitable processes may be used to form the conductive features 105.

In some embodiments, one or more etch stop layers may be deposited over the layer 100, such as etch stop layer 110 and/or etch stop layer 120. In some embodiments, etch stop layer 110 and etch stop layer 120 may comprise a nitride, oxide, carbide, carbon-doped oxide, and/or combinations thereof. In some embodiments, etch stop layer 110 and etch stop layer 120 may also include metal or semiconductor material, such as an oxide, nitride, or carbide of a metal or semiconductor material. Such materials may include, for example, aluminum nitride, aluminum oxide, silicon carbide, silicon nitride, silicon carbide, and the like. The etch stop layer 110 may be formed from a different material or the same material as the etch stop layer 120. In one embodiment, the etch stop layer 110 may be formed of aluminum nitride and the etch stop layer 120 may be formed of aluminum oxide. Etch stop layer 110 and etch stop layer 120 may be formed by any suitable method, such as by Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In accordance with some embodiments, the etch stop layer 110 and/or etch stop layer 120 may also be utilized as a diffusion barrier layer for preventing undesirable elements, such as copper, from diffusing into a subsequently formed layer. In some embodiments, each of the etch stop layer 110 and/or etch stop layer 120 may include one or more distinct layers. The etch stop layer 110 and/or etch stop layer 120 may each be deposited to a total thickness of between about 30 Å and about 100 Å, such as about 50 Å.

Following depositing the etch stop layer 120 (or etch stop layer 110, if etch stop layer 120 is omitted), a dielectric layer 130 may be formed using any suitable material by any suitable formation process. In one embodiment, the dielectric layer 130 may include a silicon oxide network, such as silicon oxide formed by or from tetraethylorthosilicate (TEOS), or the like. The dielectric layer 130 may be formed by any suitable process, such as by Plasma Enhance Chemical Vapor Deposition (PECVD), High-Density Plasma (HDP) deposition, or the like. Other silicate oxides may be used instead of TEOS, such as tetramethylorthosilicate (TMOS), or the like. In some embodiments, the dielectric layer 130 may include silicon carbide, silicon oxynitride, or the like.

In some embodiments, following the formation of the dielectric layer 130, a nitrogen-free anti-reflective coating (NF-ARC) 140 may be formed which may aid in a subsequent photo patterning process. The NF-ARC 140 may be formed using any acceptable process and may include any suitable oxide. In some embodiments, the dielectric layer 130 may be used as an NF-ARC rather than including a separate layer.

Next, bottom electrode vias 145 are formed by any suitable method. For example, openings may be made in the NF-ARC 140, dielectric layer 130, etch stop layer 120, and etch stop layer 110 by any suitable process, such as by a photo-patterning process, using a patterned photo resist (not shown). The pattern of the patterned photo resist may be transferred to each of the layers by appropriate etching process using etchants selective to the material of each layer. In some embodiments, the NF-ARC 140 may act as a hard mask. In other embodiments, a separate hard mask (not shown) may be deposited over the NF-ARC 140 prior to etching the openings for the bottom electrode vias 145. After the conductive features 105 are exposed by these openings, openings are then filled with a conductive material to form bottom electrode vias 145.

In some embodiments, a conductive barrier layer (not shown) may be formed in the openings first. The conductive barrier layer may be similar to that described above with respect to conductive features 105. In some embodiments, the conductive material of the bottom electrode vias 145 may overfill the via openings and a planarization process, such as a chemical mechanical polishing (CMP) process may be used to remove excess conductive material of the bottom electrode vias 145 and planarize the top of the bottom electrode vias 145 with the top of the NF-ARC 140. In embodiments using a conductive barrier layer to line the via openings, excess portions thereof which may be formed on the NF-ARC 140 may also be removed by the planarization process.

The conductive material of the bottom electrode vias 145 may be formed by any suitable deposition process, such as by electro-plating, electroless plating, CVD, PVD, and the like. The conductive material of the bottom electrode vias 145 may include any suitable conductive material, such as titanium nitride, copper, aluminum, and the like.

Figure 2:
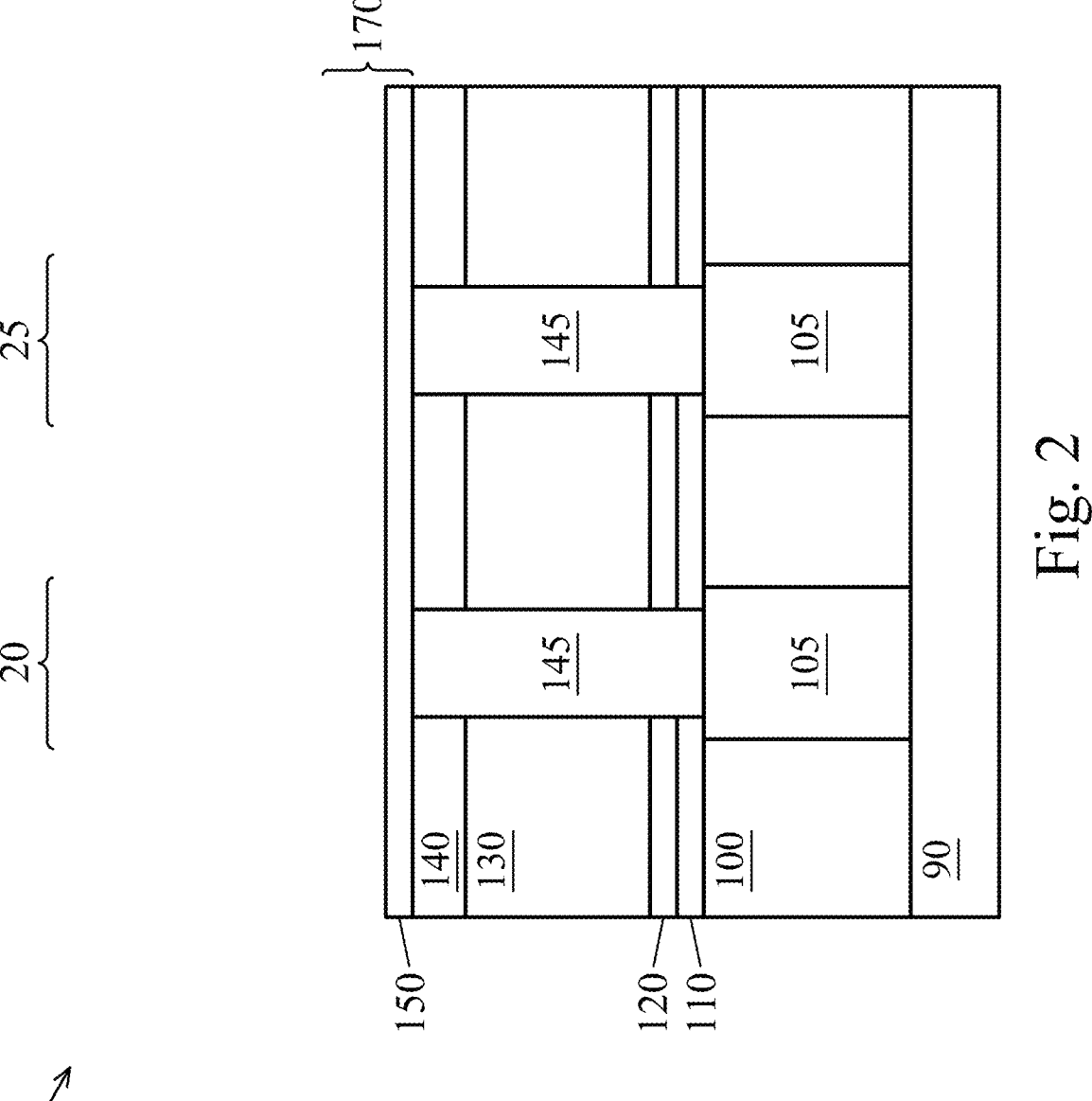

Referring to FIG. 2, a bottom electrode 170 of the MRAM device 10 may be formed. In some embodiments, the bottom electrode 170 may include a single layer, while in other embodiments, the bottom electrode 170 may include multiple distinct layers of either the same material or of distinctive materials. In some embodiments, the bottom electrode 170 may include single layer of titanium nitride, tantalum nitride, nitrogen, titanium, tantalum, tungsten, cobalt, copper, or the like. In some embodiments, the bottom electrode 170 may include a multi-layer of titanium nitride, titanium, and titanium nitride; tantalum nitride, tantalum, and tantalum nitride; tantalum, tantalum nitride, and tantalum; titanium, titanium nitride, and titanium; tantalum and titanium nitride; titanium and tantalum nitride; titanium nitride and tantalum nitride; titanium nitride and tungsten; tantalum nitride and tungsten; and so forth. In short, in embodiments where the bottom electrode 170 has a multi-layer formation, the layers may include two or more layers of the single layer materials.

The bottom electrode 170 may be formed using any suitable process, including DC PVD, RFDC PVD, CVD, ALD, pulse DC, and so forth. The bottom electrode 170 may be deposited to a thickness of about 50 Å to about 3000 Å, though other thicknesses are contemplated and may be used.

For example, a first layer 150 of the bottom electrode 170 may include or be composed of tantalum nitride and may be deposited to a thickness between about 50 Å to about 3000 Å by DC PVD, RFDC PVD, CVD, ALD, pulse DC, and so forth. In some embodiments, following the deposition of the first layer 150, a planarization process may be used to thin and/or level the first layer 150.

Figure 3:
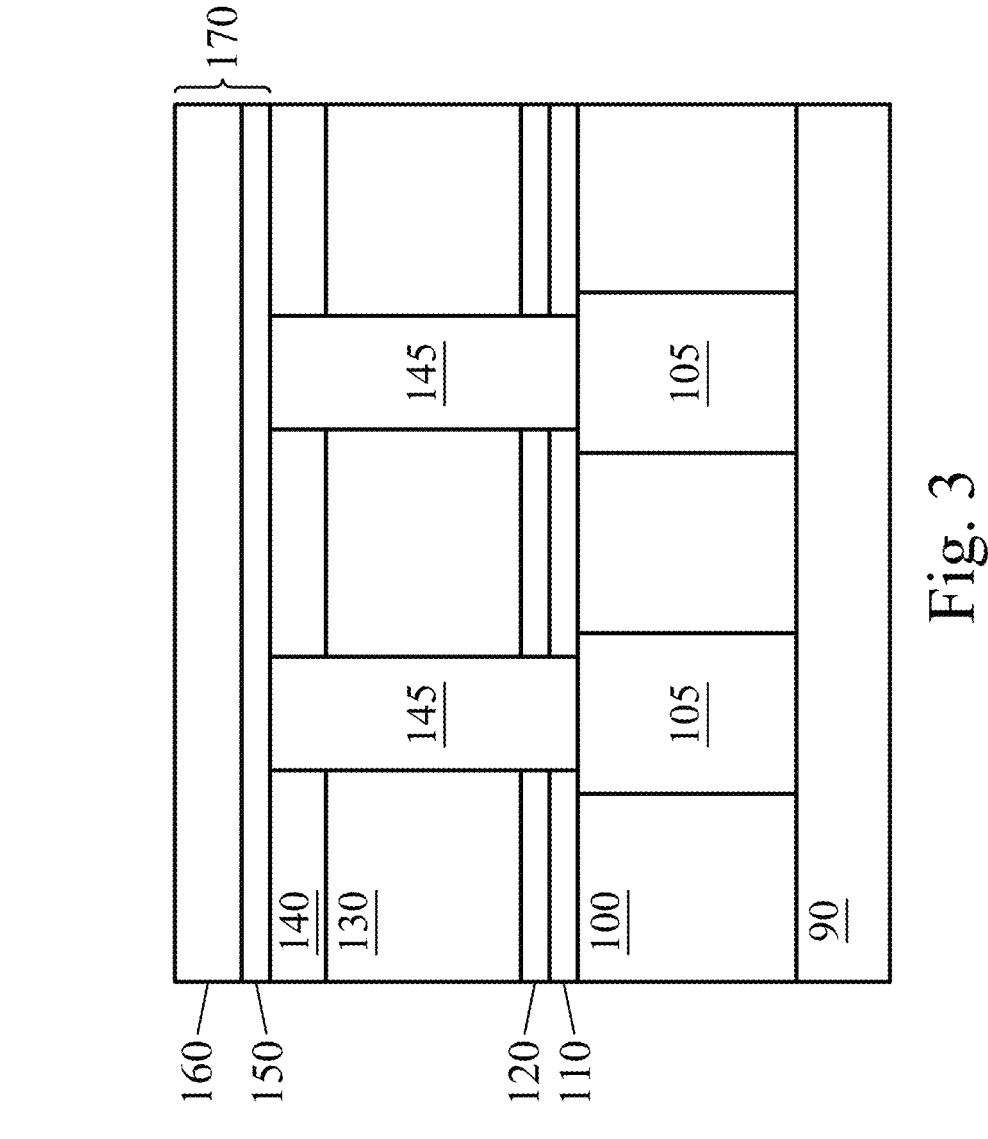

Referring to FIG. 3, following formation of the first layer 150, a second layer 160 of the bottom electrode 170 may include or be composed of titanium nitride and may be deposited to a thickness between about 50 Å to about 3000 Å by DC PVD, RFDC PVD, CVD, ALD, pulse DC, and so forth. In some embodiments, the second layer 160 of the bottom electrode 170 may include titanium nitride which is deposited according to the processes described with respect to the top electrode 190 (see FIG. 7) to achieve a dominant crystal orientation (111).

Figure 4:
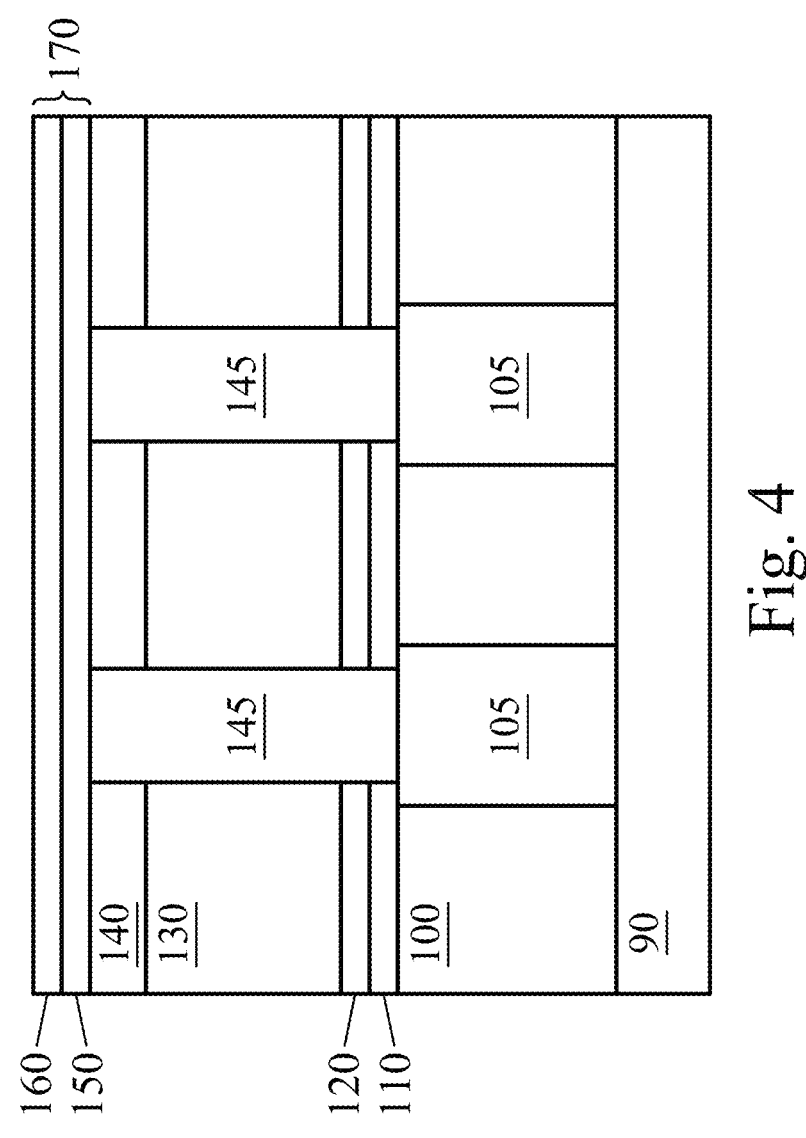
Figure 4:
Figure 4:

Referring to FIG. 4, following formation of the second layer 160, a planarization process, such as a CMP process, may be used to thin and/or level the second layer 160. Following the formation of the bottom electrode 170, the total thickness of the bottom electrode 170 may be between about 50 Å to about 3000 Å, though other thicknesses are contemplated and may be used.

Figure 5:
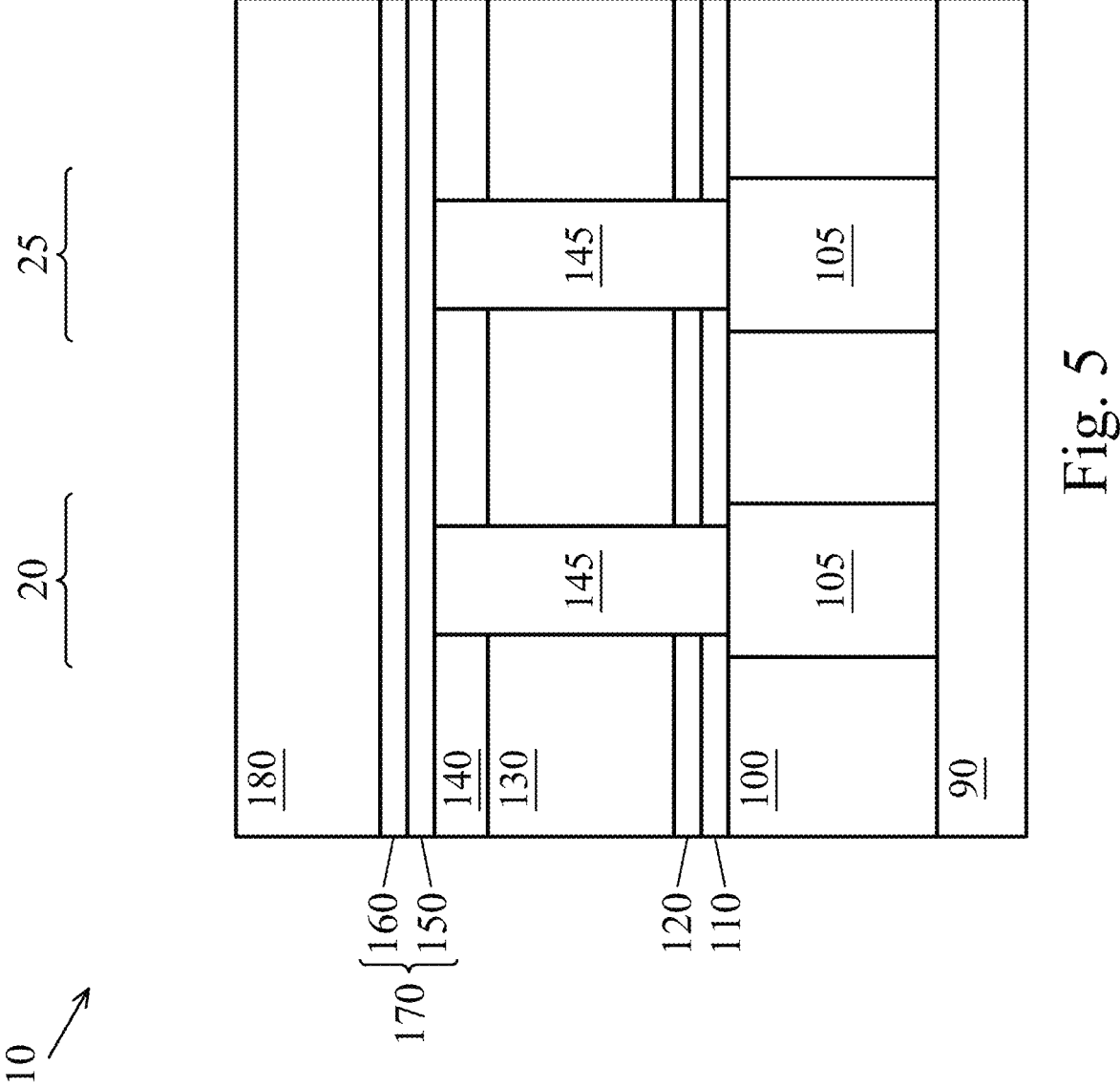

Referring to FIG. 5, following the deposition of the bottom electrode 170 of the MRAM device 10, the magnetic tunnel junction (MTJ) structure 180 may be formed. The MTJ structure 180 may include any suitable configuration for a MTJ of an MRAM device, such as MRAM device 10. Various configurations for MTJ structure 180 are discussed with respect to FIGS. 6A, 6B, and 6C.

Figures 6A, 6B, 6C:
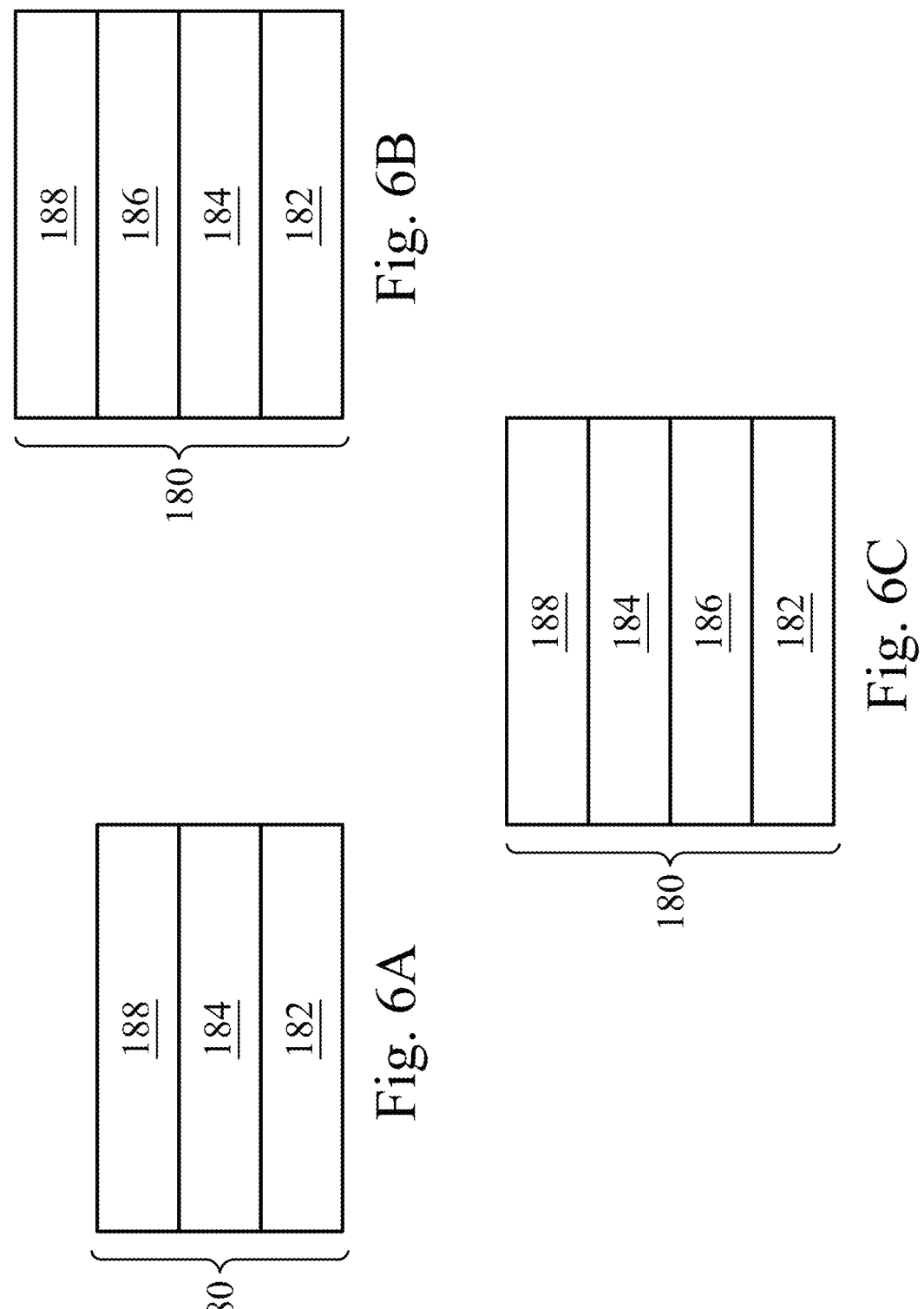

Referring to FIGS. 6A, 6B, and 6C, various example configurations MTJ structure are illustrated, in accordance with some embodiments. It should be understood that any suitable structure may be used for the MTJ structure 180.

In FIG. 6A, the layers of MTJ structure 180 may include an anti-ferromagnetic layer 182, a pinning layer 184, and a free layer 188. In FIGS. 6B and 6C, MTJ structure 180 may also include one or more tunnel barrier layers 186. In FIG. 6B, the tunnel barrier layer 186 is disposed between the pinning layer 184 and the free layer 188. In FIG. 6C, the tunnel barrier layer 186 is disposed between the anti-ferromagnetic layer 182 and the pinning layer 184. A tunnel barrier layer 186 may be disposed in each of the positions illustrated in FIG. 6C. In addition, more layers of MTJ structure 180 may be incorporated into the MRAM device 10, including additional tunnel barrier layers, anti-ferromagnetic layers, pinning layers, and free layers.

The anti-ferromagnetic layer 182 is formed on the bottom electrode 170, the pinning layer 184 is formed over the anti-ferromagnetic layer 182, and the free layer 188 is formed over the pinning layer 184. However, other arrangements of the MTJ structure 180 are contemplated. For example, the layers may be formed in reverse order. The anti-ferromagnetic layer 182, the pinning layer 184, and the free layer 188 may be formed sequentially.

The pinning layer 184 may be formed of, for example, platinum manganese (PtMn). The anti-ferromagnetic layer 182 may be formed of, for example, iridium manganese (IrMn), platinum manganese (PtMn), iron manganese (FeMn), ruthenium manganese (RuMn), nickel manganese (NiMn), and palladium platinum manganese (PdPtMn), and the like, or alloys thereof. The free layer 188 may be formed of Cobalt-Iron-Boron (CoFeB). If included within the MTJ structure 180, tunnel barrier layer 186 may be formed from magnesium oxide (MgO). It should be recognized that the various layers of the MTJ structure 180 may be formed of other materials. The anti-ferromagnetic layer 182, pinning layer 184, free layer 188, and tunnel barrier layer 186 may respectively be formed using any suitable process, for example, by DC PVD, RFDC PVD, CVD, ALD, pulse DC, and so forth.

7

Figure 7:
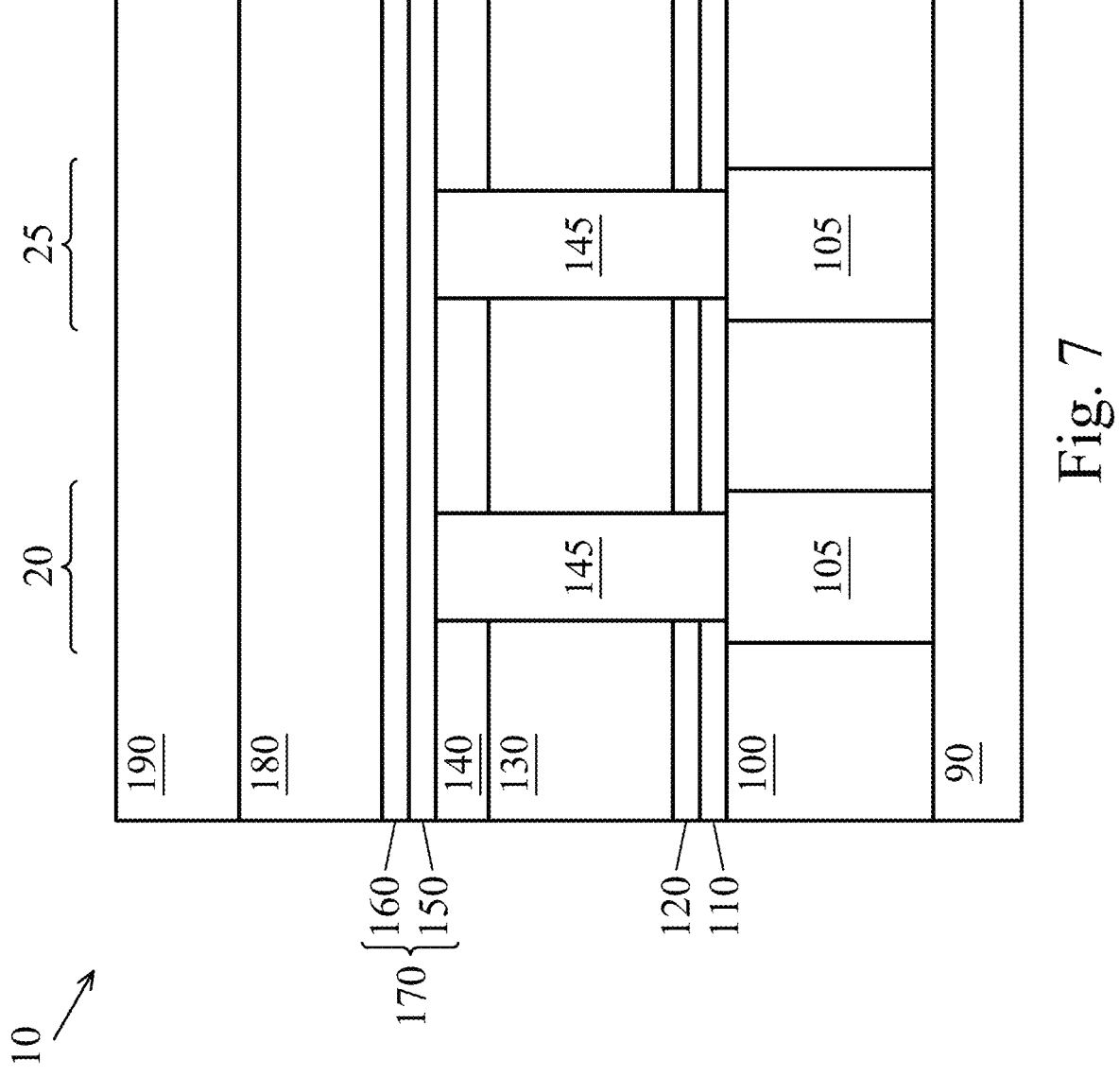

Referring to FIG. 7, following the formation of the MTJ structure 180, a top electrode 190 is formed. Rather than form the top electrode 190 from a multi-layer structure of tantalum nitride, tantalum, and tantalum nitride, which may be subject to oxidation, the top electrode 190 may be formed from a single or multi-layer structure of titanium nitride. Using a single layer of titanium nitride for the top electrode 190 of the MRAM device 10 advantageously simplifies the process of forming the top electrode 190. Also, the crystal orientation (111) of the top electrode 190 helps to inhibit oxygen from diffusing into the MTJ structure 180. A suitable deposition process using titanium nitride for the material of the top electrode 190 can result in a predominant crystal orientation (111) of the top electrode 190. Other materials may also be used in place of the titanium nitride, including multi-layers which may or may not include titanium nitride as one or more layers of the multi-layers of the top electrode 190. The crystal orientation (111) may be achieved in the other materials listed below, however, it may not be the dominant orientation. As such, in embodiments where a material other than titanium nitride is used in the formation of the top electrode 190, a thicker top electrode 190 can provide better protection against oxidation of the MTJ structure 180.

In some embodiments, the top electrode 190 may include single layer titanium nitride, tantalum nitride, titanium, tantalum, tungsten, cobalt, copper, or the like. In some embodiments, the top electrode 190 may include a multi-layer of titanium nitride, titanium, and titanium nitride; tantalum nitride, tantalum, and tantalum nitride; tantalum, tantalum nitride, and tantalum; titanium, titanium nitride, and titanium; tantalum and titanium nitride; titanium and tantalum nitride; titanium nitride and tantalum nitride; titanium nitride and tungsten; tantalum nitride and tungsten; and so forth. In short, top electrode 190 having a multi-layer formation may include two or more layers of the single layer materials.

In embodiments where the top electrode 190 contains titanium nitride, the top electrode 190 may be deposited to a thickness of about 50 Å to about 3000 Å, such as about 1000 Å, though other thicknesses are contemplated and may be used. In embodiments where the top electrode 190 contains materials which do not include titanium nitride, a non-dominant (111) crystal orientation may be exhibited. In such embodiments, the top electrode 190 may be deposited to a thickness of about 200 Å to about 5000 Å, such as about 2000 Å, or a thickness of about 1000 Å to about 5000 Å, such as about 2000 Å, though other thicknesses are contemplated and may be used. In general, a thicker top electrode 190 provides the ability to better inhibit oxygen infiltration, however, using a top electrode 190 made of titanium nitride with a dominant (111) crystal orientation allows the thickness of the top electrode 190 to be reduced to achieve the same oxygen inhibiting effects as a thicker top electrode 190 which does not contain titanium nitride with a dominant (111) crystal orientation. In some embodiments the thickness of the top electrode 190 made of titanium nitride with a dominant (111) crystal orientation may be between about 25% and about 60% of the thickness of a top electrode made of materials which do not include titanium nitride in a (111) dominant crystal orientation. This can advantageously result in a thinner film stack. In forming the top electrode 190, the workpiece (e.g., MRAM device 10) may be pre-heated by any acceptable tool including heating control elements located in an electrostatic chuck, by a lamp heater, and so forth. In some embodiments, prior to or after depositing the top electrode 190 a pre-clean process may be used, including a plasma treatment, heating, nitrogen treatment, and so forth.

Figures 8A, 8B:
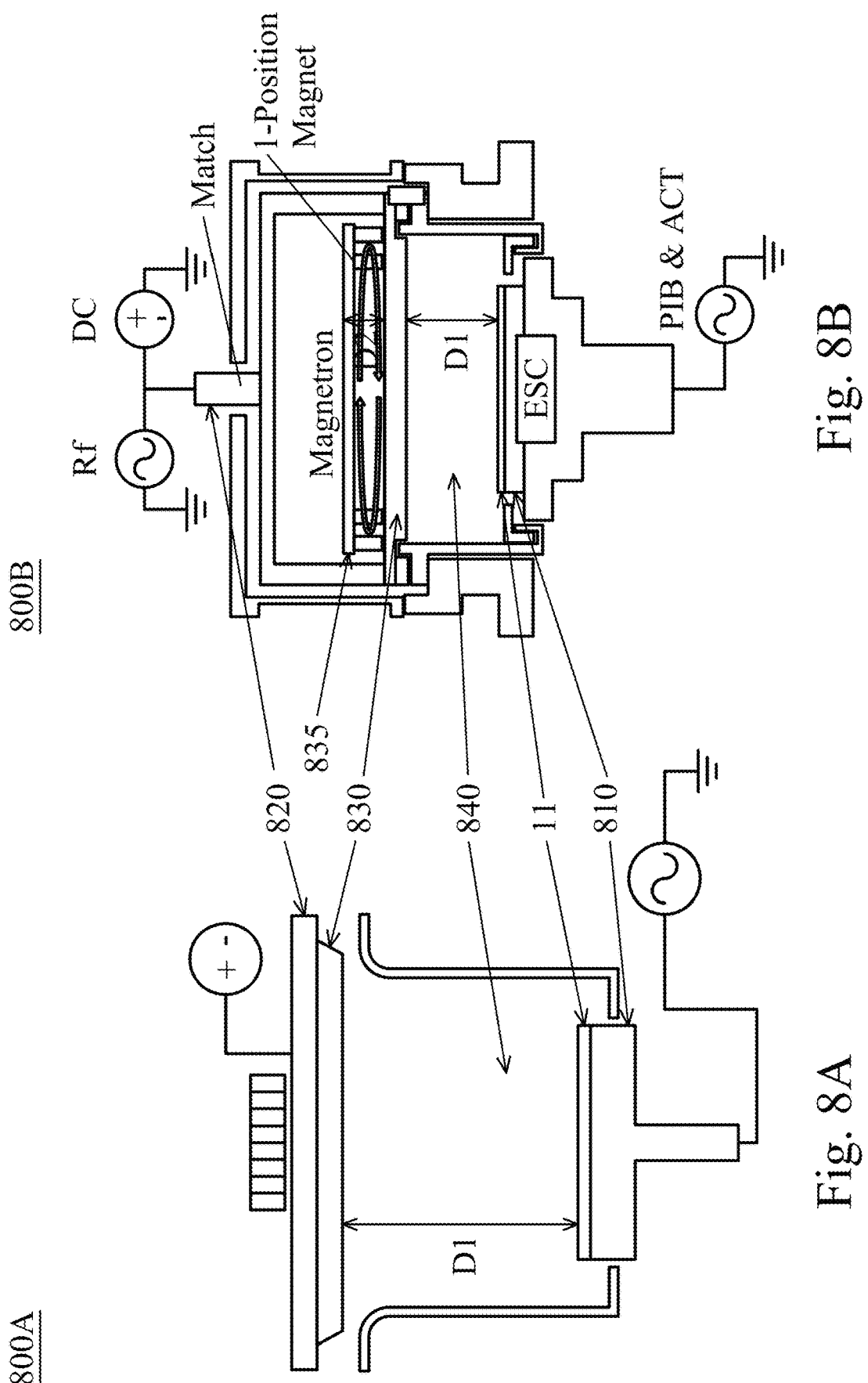
FIGS. 8A and 8B illustrate deposition chambers which may be used to form a top electrode of an MRAM device, in accordance with some embodiments.

Referring to FIGS. 8A and 8B, the top electrode 190 may be formed using any suitable process, including DC PVD, Bias DC PVD, RFDC PVD, and RFDC PVD with magnetron. For DC PVD and bias DC PVD, an example deposition chamber is illustrated in FIG. 8A. For RFDC PVD and RFDC PVD with magnetron, an example deposition chamber is illustrated in FIG. 8B. A workpiece 11, such as will be made into the MRAM device 10, is positioned on a chuck, such as an electrostatic chuck 810. A target 830 is positioned in the chamber as a source for the material deposited on the workpiece 11. A cathode 820 may be biased using voltage and/or radio frequency (RF). The distance $D_1$ between the workpiece 11 and target may be controlled. In FIG. 8B, a magnetron 835 may be used and positioned above the target, and the distance D2 between the magnetron 835 and the target 830 may be controlled.

The target 830 is manufactured from the material to be deposited on the workpiece 11. In forming the top electrode 190 of the MRAM device 10, for each of the one or more layers of the top electrode 190, the material to be deposited may include a metal, such as titanium or tantalum. In embodiment using a multi-layer top electrode 190, the target 830 may be changed from one material to another for each layer. As the target 830 is struck by the plasma generated in the chamber, material will be transferred from the target 830 to the workpiece 11. Where titanium nitride is deposited the target may be made of titanium or titanium nitride. In embodiments where the target is made of titanium, as the titanium is transferred from the target to the workpiece 11, process gasses 840 including nitrogen can directly nitridate the titanium prior to or during deposition, thereby forming a titanium nitride layer on the workpiece 11. The target 830 may be larger than the size of the workpiece 11 to improve the uniformity of the deposited film. The shape of the target 830 may be defined such as a circle, rectangle, ellipse, oval, square, triangle, regular or irregular polygon, and so forth. In some embodiments, the shape of the target 830 may be the same shape as the workpiece 11 (e.g., MRAM device 10). Process gasses 840 may also include an inert gas introduced between the workpiece 11 and the target 830. Argon (Ar) may be used, however, it is realized herein that other gases, inert or not, may be employed in addition to, or in lieu of argon as process gasses 840, in some applications. For example, a mixture of argon and nitrogen may be used to deposit titanium nitride from a titanium target.

Referring to FIG. 8A, bias DC PVD operation is described first. In bias DC PVD operation, a DC voltage is applied between the workpiece 11 and the target 830. For example, negative DC bias may be applied to the target 830 relative to the workpiece 11. Accordingly, the target 830 is the cathode and the workpiece 11 is the anode. As a result of the application of the DC voltage, an electric field is established between the workpiece 11 and the target 830. The workpiece 11 may be grounded and the target 830 may be provided a negative bias with respect to ground. Under the influence of the electric field, an electron leaves the target 830 and accelerates towards the workpiece 11. In a chance collision with an atom of the process gasses 840, such as an inert process gas, the electron ionizes the atom of the process gasses 840, creating a new free electron and an inert gas ion. Since the inert gas ion is positively charged, it is attracted to the negatively biased target 830. The inert gas ion collides with the target 830 and ejects a target atom of the material of the target 830 away from the target 830. The target atom may land on the workpiece 11 (e.g., MRAM device 10), where it contributes to the formation of the top electrode 190. It is appreciated herein that the single ionization event described above is of an exemplary nature and that in practice many ionization events involving many electrons and inert gas atoms take place. Furthermore, in addition to electrons leaving the target 830, electrons generated in ionization events may also accelerate towards the workpiece 11 and ionize additional inert gas atoms of the process gasses 840. In this manner, a plasma comprising many electrons and ions is formed between the target 830 and the workpiece 1110, resulting in many atoms sputtered from the target 830 and formed as the top electrode 190.

Using bias DC PVD, where the top electrode 190 includes titanium nitride, the titanium nitride may be formed with a suitable crystal orientation when the DC power range is between about 1 kW to 30 kW, such as about 10 kW, though other values may be used. DC bias voltage can be between about 200 V to about 900 V, such as about 500 V, though other values are contemplated and may be used. Current control may be between about 5 A and about 35 A, such as about 10 A, though other values are contemplated and may be used. Processes gasses may include nitrogen ($N_2$) and argon (Ar) and may flow between about 10 and 1000 sccm, such as about 400 sccm, though other flow rates may be used. Process gasses may be provided at a pressure between about 10 and 400 mTorr, such as about 50 mTorr, though other pressures may be used. The workpiece 11 (e.g., MRAM device 10) may be heated between about 200° C. and about 450° C., such as about 300° C., though other temperatures may be used.

Still referring to FIG. 8A, DC PVD may also be used without bias. In DC PVD, a plasma is generated from process gasses 840 without using bias control. The plasma creates radicals and ions of the process gasses 840 which expand in all directions, including hitting the target 830 and freeing material from the target 830. The energy transfer from the radicals and ions to the material causes the material to accelerate in various directions, including toward the workpiece 11, resulting in many atoms sputtered from the target 830 and formed as the top electrode 190.

Using DC PVD, where the top electrode 190 includes titanium nitride, the titanium nitride may be formed with a suitable crystal orientation when the DC power range is between about 1 kW to 30 kW, such as about 10 kW. Processes gasses 840 may include nitrogen ($N_2$) and argon (Ar) and may flow between about 10 and 1000 sccm, such as about 400 sccm, though other flow rates may be used. Process gasses 840 may be provided at a pressure between about 1 and 100 mTorr, such as about 50 mTorr, though other pressures may be used. The workpiece 11 (including MRAM device 10) may be heated between about 200° C. and about 450° C., such as about 300° C., though other temperatures may be used.

Referring to FIG. 8B, an RF PVD and RFDC PVD operation are described. Both the RF PVD and RFDC PVD techniques operate in a similar manner to the bias DC operation. In RF PVD operation, however, an RF voltage (i.e., AC) bias may be applied instead of the DC power. In RFDC PVD operation, both an RF voltage bias and DC bias are applied. Including the RF bias, any positive charge collected on the target 830 during each half cycle is cancelled during the succeeding half cycle, preventing a significant charge buildup over time.

Using RF PVD or RFDC PVD, where the top electrode 190 includes titanium nitride, the titanium nitride may be formed with a suitable crystal orientation when the RF bias frequency is greater than or equal to about 13.56 MHz, such as greater than about 40 MHz. AC bias power can be controlled to be between about 100 W and about 1000 W, such as about 500 W, though other values may be used. Where DC bias is also used (RFDC PVD), DC power range may be between about 1 kW to 30 kW, such as about 5 kW, though other values may be used. DC bias voltage can be between about 200 V to about 900 V, such as about 500 V, though other values are contemplated and may be used. DC current control may be between about 5 A and about 35 A, such as about 10 A, or between about 15 A and about 25 A, such as about 20 A, though other values are contemplated and may be used. Processes gasses 840 may include nitrogen ($N_2$) and argon (Ar) and may flow between about 10 and 1500 sccm, such as about 400 sccm, though other flow rates may be used. Process gasses 840 may be provided at a pressure between about 10 and 400 mTorr, such as about 50 mTorr, though other pressures may be used. The workpiece 11 (e.g., MRAM device 10) may be heated between about 200° C. and about 450° C., such as about 300° C., though other temperatures may be used. The spacing distance $D_1$ from the workpiece (e.g., MRAM device 10) to the target may be between about 55 to 65 mm, such as about 60 mm, though other values may be used.

In some embodiments, a magnetron 835 may be used, such as illustrated in FIG. 8B. Any of the previously described deposition techniques may use the magnetron 835, including DC PVD, bias DC PVD, RF PVD, and RFDC PVD. The efficiency of the deposition process may be enhanced through the use of a magnetron arrangement. In a magnetron PVD deposition system, magnets may be used to generate a magnetic field in the vicinity of the target 830. The direction of the resulting magnetic field is approximately perpendicular to the electric field over much of the target 830. Electrons are substantially confined to these crossed fields, and therefore substantially the plasma concentrates in the vicinity of the target 830. This confinement reduces the probability of deleterious collisions between electrons and the workpiece 11, and increases the efficiency of the deposition process. The spacing distance D2 from the target 830 to the magnetron 835 may be between about 38 to 46 mm, such as about 42 mm, though other values may be used.

In some embodiments, pulsing can be used. Several cycles of deposition can be performed in a pulsing operation under vacuum with or without process gasses 840. In other embodiments, other deposition techniques may be used, such as ALD, CVD, and so forth.

Obtaining a desired crystalline film for mitigating oxygen effects in subsequent processing of MRAM device 10 can be achieved through the growth of a crystalline film having a strong (111) crystal orientation. Growing oriented grains may be achieved by using low energy deposition techniques. In low energy deposition techniques electron energy is more controlled than in high energy deposition. Using bias control provides the ability to use lower ion energy while maintaining high intensity. RF bias also provides strong intensity, but also may have increased ion energy. Using the magnetron 835 can counteract and control some of the excess energy for ions which carry more energy than desired. As ions of the target material bombard the workpiece 11, because the ions are low energy, they are less likely to dislodge, displace, or damage other atoms which have already deposited on the workpiece 11. Loss electrons can accumulate and deionize the ions of the target material, resulting in the (111) oriented crystalline structure.

Figures 9A, 9B:
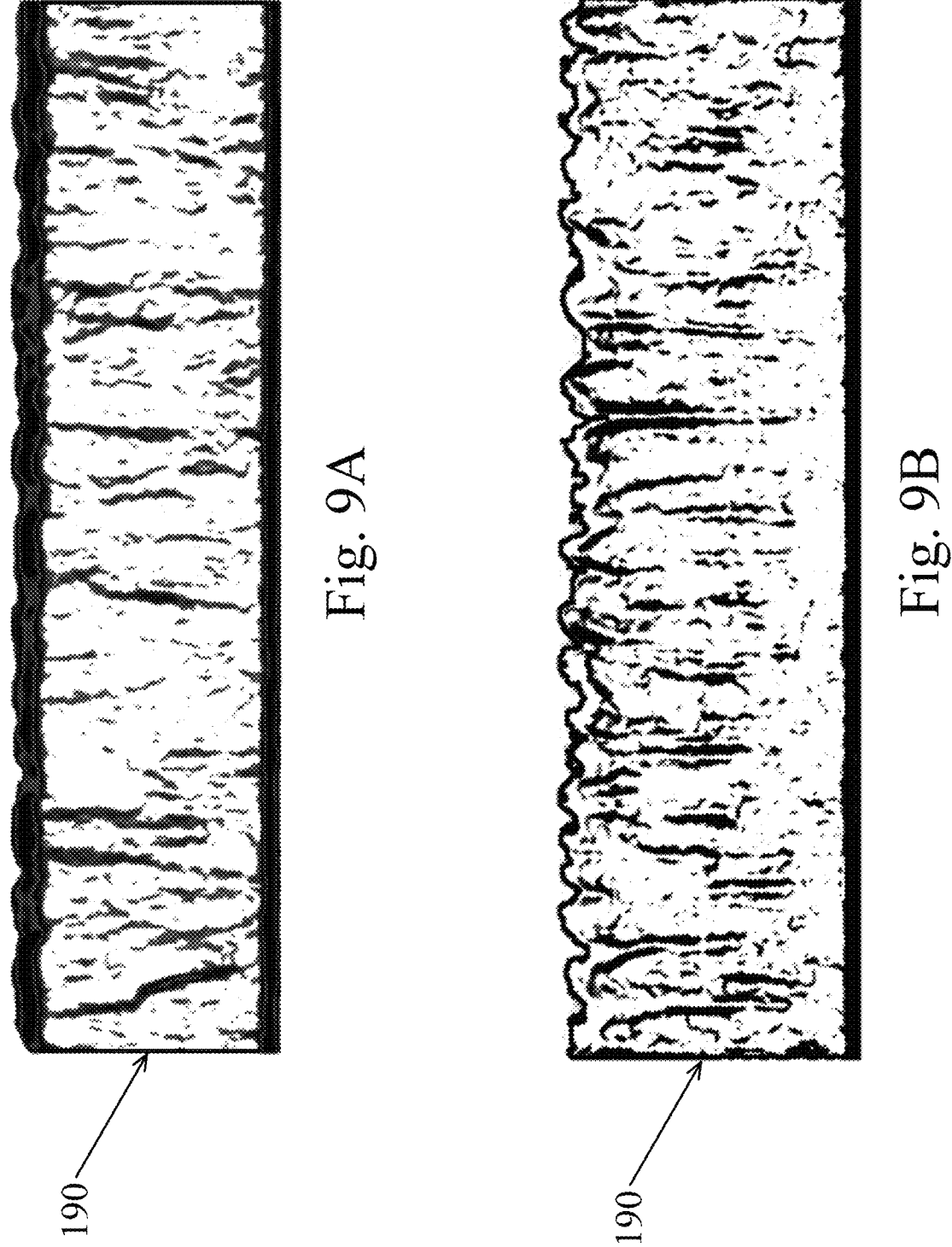
FIGS. 9A and 9B illustrate a top electrode film of an MRAM device, in accordance with some embodiments.

Referring to FIGS. 9A and 9B, an example top electrode 190 layer is illustrated using two different deposition techniques. In FIG. 9A, a DC bias is used, resulting in a strongly oriented crystalline film. The top of the film is also quite smooth. In contrast, a top surface of tantalum nitride is rougher than the top surface of the titanium nitride film illustrated in FIG. 9A. In embodiments including a tantalum nitride layer and a titanium nitride layer, the top surface of the titanium nitride layer will be smoother than the top surface of the tantalum nitride layer. The top electrode 190 depicted in FIG. 9A can better withstand oxygen infiltration in subsequent processing of forming MRAM device 10. In FIG. 9B, a bias is not used. As a result, the grains are not as strongly oriented and the top surface is rougher.

Figure 10:
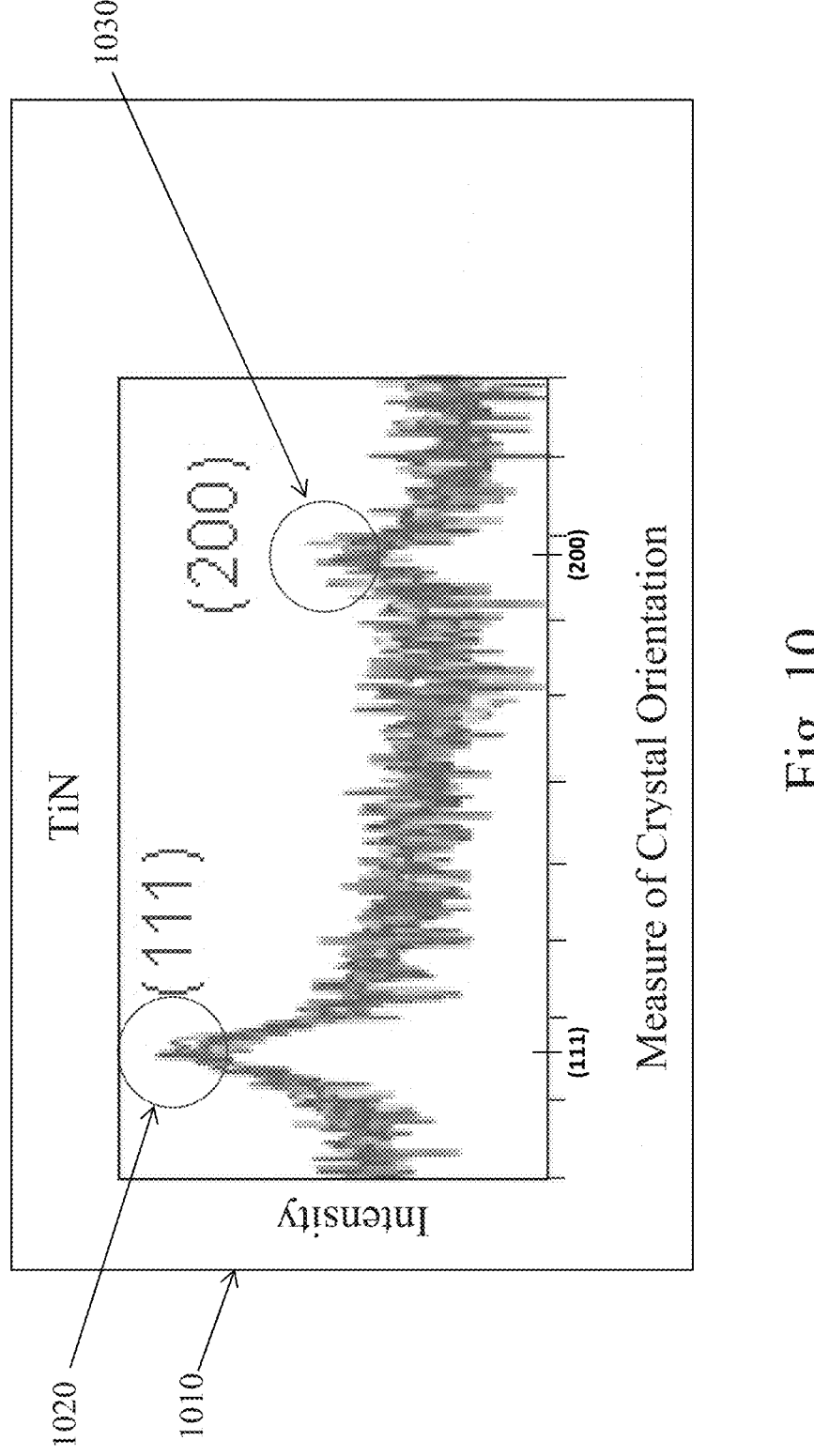
FIGS. 10 and 11 illustrate various properties of an MRAM device, in accordance with some embodiments.

Referring to FIG. 10, in some embodiments, the top electrode 190 may be deposited to show strong crystal orientation (111). Graph 1010 illustrates that the intensity of crystal orientation (111) at marker 1020 is greatest among the lattice planes demonstrated at different process conditions. Graph 1010 illustrates that the intensity of crystal orientation (200) at marker 1030 is second greatest among the lattice planes demonstrated at different process conditions. The intensity of crystal orientation at (111) may be between about 25% to about 100% greater than the intensity of crystal orientation at (200).

Figure 11:
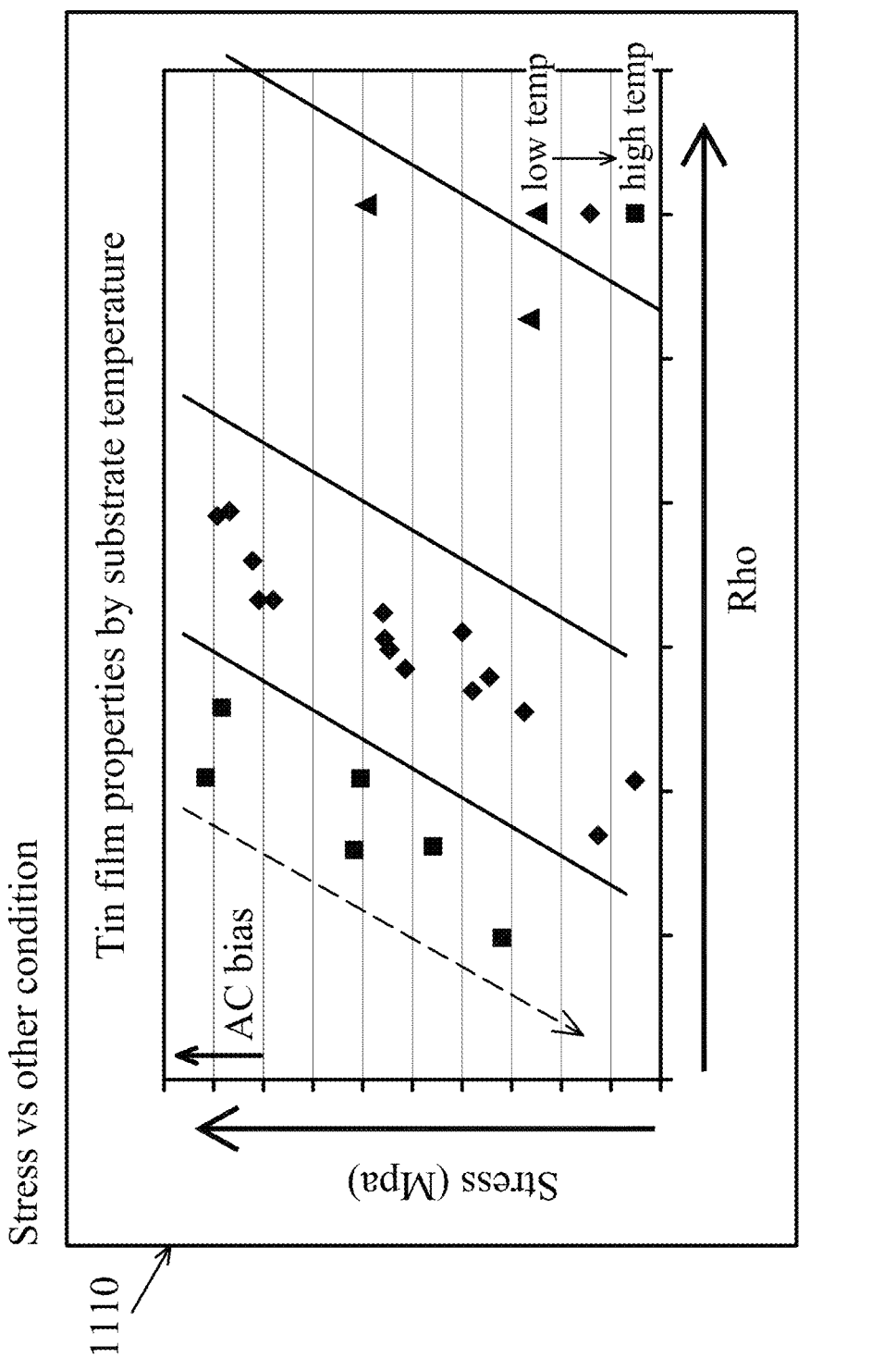

Referring to FIG. 11, the top electrode 190 may be deposited to control the film stress. In some embodiments, the tensile stress of the top electrode 190 may be controlled to be greater than about 400 Mpa, though other values are contemplated and may be used. Controlling the stress of the film of the top electrode 190 to be greater than about 400 Mpa also contributes to preventing oxygen from infiltrating the MTJ structure 180. As shown in the graph 1110 of FIG. 11, as AC bias is increased film stress may be increased at different substrate temperatures. In some embodiments, top electrode 190 may be doped by a suitable dopant, such as carbon or silicon to enhance and/or further control film stress. Carbon may be doped to a concentration between about $1.0 \times 10^{22}$ cm$^{-3}$ and about $1.0 \times 10^{24}$ cm$^{-3}$. Silicon may be doped to a concentration between about $1.0 \times 10^{22}$ cm$^{-3}$ and about $1.0 \times 10^{24}$ cm$^{-3}$. Silicon or carbon may be doped in situ during the formation of the top electrode 190 or may be doped by subsequent ion implantation. Higher concentrations of dopants exhibit greater stresses in the top electrode 190. Selecting carbon and/or silicon to have doping concentrations in the above ranges provides tunable film stress without negatively impacting the conductive properties of the top electrode 190. Other dopant concentrations are contemplated and may be used instead.

Figure 12:
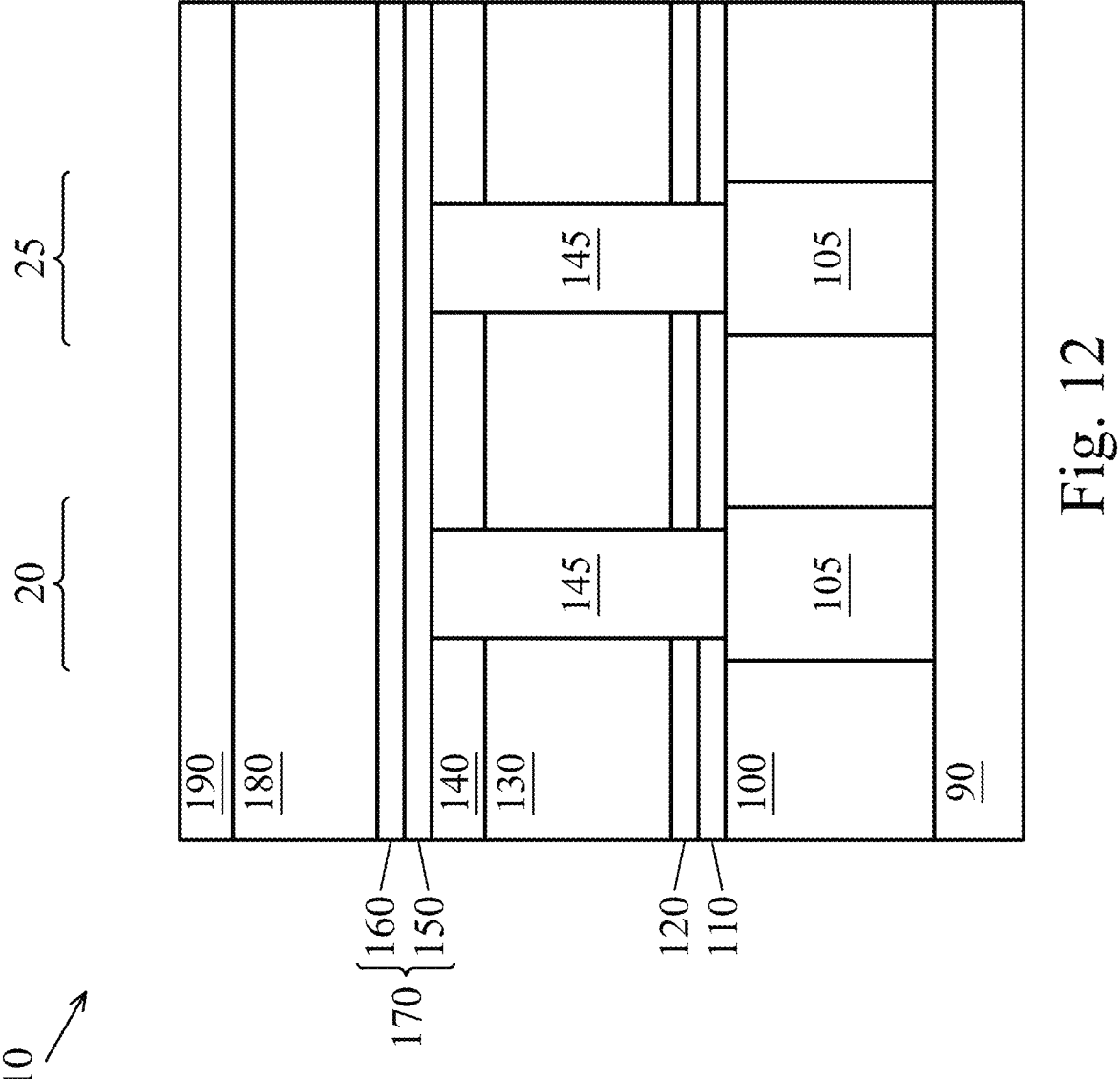
FIG. 12 illustrates an intermediate step in the process flow forming the MRAM device, in accordance with some embodiments.

Referring to FIG. 12, following the formation of the top electrode 190, the top electrode 190 may be thinned to a desired thickness. The thinning may be done by any suitable process. In some embodiments, an ion beam etch cleaning process may be performed to thin the top electrode 190 to a desired thickness. In other embodiments a wet etch may be used. In still other embodiments a chemical mechanical polishing (CMP) process may be used.

Figure 13:
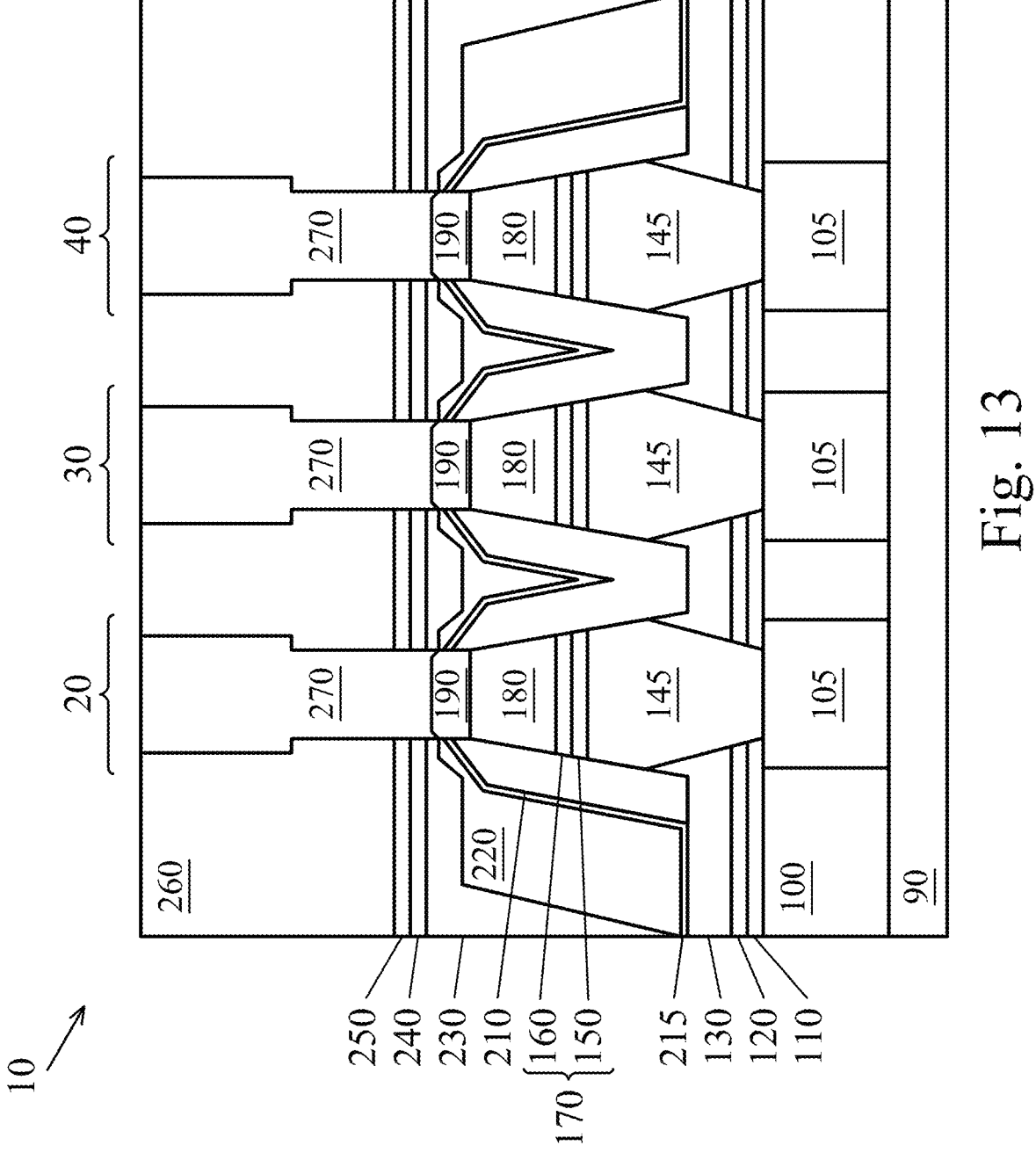
FIG. 13 illustrates a cross sectional view of an MRAM device, in accordance with some embodiments.

Referring to FIG. 13, a cross-sectional view of the MRAM device 10 is illustrated after it has been patterned into separate MRAM cells, such as MRAM cell 20, MRAM cell 30, and MRAM cell 40. The cross section of FIG. 13 is a perpendicular cross section of the MRAM device 10 to the cross section illustrated in FIG. 12.

Each of the MRAM cells may be patterned using any suitable technique, such as a photo-patterning technique. During the patterning, because the strong crystal orientation (111) of the top electrode 190, oxygen infiltration of the MTJ structure 180 is reduced or eliminated. Choosing the material of the top electrode 190 as titanium nitride also helps reduce or eliminate oxygen infiltration of the MTJ structure 180. After patterning the MRAM device 10 into MRAM cells, a protective dielectric layer 210 may be deposited on sidewalls of the MTJ structure to protect it from oxidation through the sidewall surfaces. The protective dielectric layer 210 may include silicon nitride or another suitable material formed by any suitable technique, such as PVD, CVD, or the like. A dielectric material layer 215 may be deposited over several MRAM cells in an MRAM device. The dielectric material layer 215 may include silicon nitride or another suitable material formed by any suitable technique, such as PVD, CVD, or the like. The resulting MRAM cell 20 of MRAM device 10 may have an interface between the top electrode 190 and the MTJ structure 180 where the bottom surface of the top electrode 190 and the top surface of the MTJ structure 180 are mated across their complete surface, that is from sidewall to sidewall, to their lateral extents, so that none of the bottom surface of top electrode 190 and none of the top surface of MTJ structure 180 extends laterally beyond the other. In other words, the MTJ structure 180 and the top electrode 190 may have a shared interface to their respective lateral extents.

Because the top electrode 190 is formed from a material which oxidizes at a relatively high temperature and has a crystal orientation (111), the top surface of the top electrode 190 may remain unprotected during formation of the protective dielectric layer 210 and dielectric material layer 215. Whereas conventional formation of these materials may require a separate protective/oxygen blocking layer, because the top electrode 190 may include titanium nitride and have a crystal orientation (111), the top electrode 190 may block oxygen from infiltrating in the subsequent processing steps. Following formation of the dielectric material layer 215, a cell gap-fill material layer 220 may be formed over each group of MRAM cells, for example for the MRAM device 10. The cell gap-fill material layer 220 may be formed of any suitable material such as a silicon oxide, polyimide, PBO, phosphosilicate glass (PSG), borosilicate glass (BSG), boron-doped phosphosilicate glass (BPSG), fluorine-doped silicate glass (FSG), tetraethyl orthosilicate (TEOS), or the like, and so forth, using any suitable deposition technique, such as CVD, PVD, ALD, flowable CVD, and so forth.

Following formation of the cell gap-fill material layer 220, device gap-fill material layer 230 may be formed over all of the dies, including the MRAM device 10 and adjacent MRAM devices formed on the same workpiece. The device gap-fill material layer 230 may be formed using materials and techniques similar to those discussed above with respect to the cell gap-fill material layer 220. Following formation of the device gap-fill material layer 230, the device gap-fill material layer 230 may be planarized, for example, by a CMP process or other suitable process to level the top surface of the device gap-fill material layer 230.

After the device gap-fill material layer 230 is leveled, optional mask layer 240 and optional mask layer 250 may be deposited over the device gap-fill material layer 230. Optional mask layers 240 and 250 may be used as etch stop layers and may be formed using materials and processes similar to those discussed above with respect to etch stop layer 110 and etch stop layer 120, respectively.

Next, an insulating layer 260 may be formed over the optional mask layer 250. The insulating layer 260 may be formed of a polymer, polyimide, phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), MethylSilsesQuioxane (MSQ), or the like. The insulating layer 260 may be formed using any suitable method, such as spin-on coating, Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like.

Contacts 270 may be formed by patterning the insulating layer 260 to form openings therein corresponding to the contacts 270. The openings may be formed using any acceptable patterning technique, for example a photoresist mask over the insulating layer 260. In some embodiments, the openings are formed using a self-aligned process. The bottom of the openings may expose substantially all of the top electrode 190 for each of the MRAM cells. Contact 270 may be formed using processes and materials similar to those discussed above with respect to conductive features 105 of FIG. 1.

After formation of contacts 270, a first interconnect (not shown) may be formed over the insulating layer 260 and a second interconnect (if not provided already in, for example, layer 100 and conductive features 105) may be formed under the layer 100 by any suitable process. The first interconnect and second interconnect can provide addressing capabilities, such as a bit line and word line to each of the MRAM cells so that each MRAM cell is individually addressable.

Figure 14:
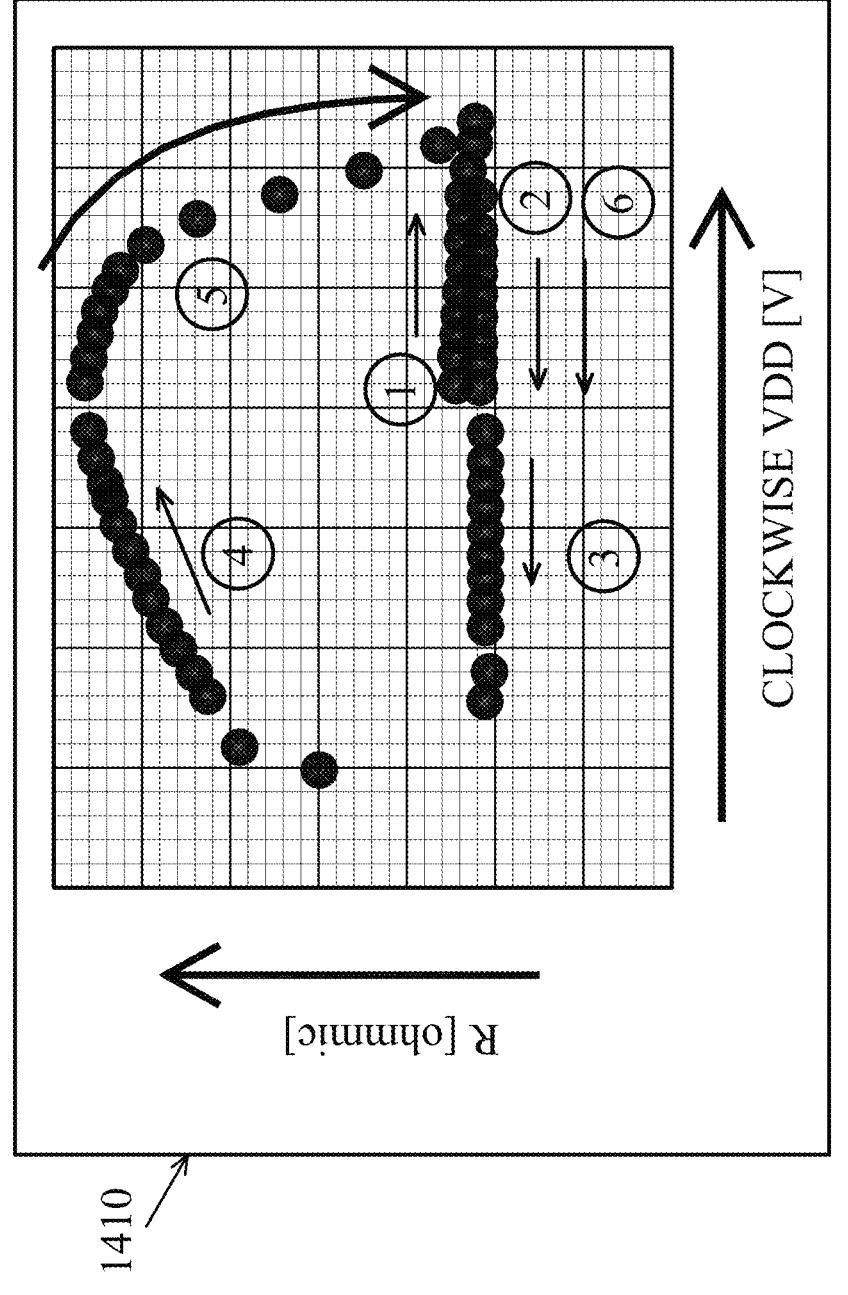
FIG. 14 illustrates properties of a MRAM device, in accordance with some embodiments.

Referring to FIG. 14, a graph 1410 illustrates an example voltage flow to change the electron spin of the MTJ structure 180. The rectangular shape of the flow indicates that electron spin reversing is functional. One of skill in the art will understand that the example in FIG. 14 is provided by way of explanation and is not intended to be limiting. In this example, when the electron spin is in one direction the ohmic value across the MTJ structure 180 may be between about 190Ω and about 200Ω. When the electron spin is reversed the ohmic value across the MTJ structure 180 may be between about 250Ω and about 285Ω. To change the electron spin a positive voltage of about 1.25 V is applied across the MTJ structure 180 (1), the voltage is removed (2), and then a negative voltage of about −1.25 V is applied across the MTJ structure 180 (3). The voltage may be removed (4). To change the electron spin back again, a positive voltage may be applied across the MTJ structure 180 (5) and then removed (6).

In some embodiments, a wafer yield and acceptance tests may be performed to test electron spin reversibility. Due to the processes used to form top electrode 190, the yield is increased because more MRAM cells include functional electron spin reversibility than when using conventional processes and materials.

From the foregoing, it should be appreciated that the MRAM device 10 has numerous advantages. For example, the material and formation of top electrode 190 is selected and formed to be protected from allowing oxygen infiltration to the MTJ structure 180 in subsequent processing steps. In particular, the structure of the top electrode 190 has a peak concentration of crystals oriented in the (111) face centered cuboid, controlled stress characteristics to provide a stressed film greater than about 400 Mpa. The material of the top electrode 190 may also, in some embodiments, include titanium nitride, which has the advantage of having a relatively high temperature at which oxidation occurs in these processes (for example, greater than about 450° C. short durations 10 seconds or less or greater than about 100°

C. at prolonged durations greater than 70 seconds). Since the titanium nitride is resistant to oxidation, diffusion of oxygen from an oxidized titanium nitride particle to the MTJ structure 180 is less likely to occur. As such, the diffusion or infiltration of oxygen to the MTJ structure 180 is mitigated or prevented, thereby preventing the MTJ structure 180 from failing electron reversibility.

In addition, the wafer acceptance tests and the circuit probe yield of the MRAM devices 10 is improved relative to conventional devices. Also, the process flow for the MRAM devices 10 may be shortened and save, for example, the cost of a protective mask (or masks) for the top electrode 190.

An embodiment is a method that includes forming a bottom electrode of over a via, the via electrically coupling the bottom electrode to a control line for a magnetoresistive random access memory (MRAM) device. A magnetic tunnel junction (MTJ) is formed over the bottom electrode. A top electrode is formed over the MTJ, a material of the top electrode being formed of a first material, the first material having an oxidation temperature greater than 450° C. at 10 seconds or less.

Another embodiment is a method including forming a bottom electrode of a magnetoresistive random access memory (MRAM) device. A magnetic tunnel junction (MTJ) is formed over the bottom electrode, the MTJ including an anti-ferromagnetic layer, a pinning layer, and a free layer. A top electrode is formed over the MTJ, the top electrode physically coupled to the free layer of the MTJ, the top electrode including titanium nitride.

Another embodiment is a magnetoresistive random access memory (MRAM) cell including a top electrode, the top electrode comprising a film of titanium nitride, the top electrode including a crystal orientation (111) as a dominant orientation concentration. The MRAM cell also includes a magnetic tunnel junction (MTJ) disposed under the top electrode, and includes a bottom electrode disposed under the MTJ.

Another embodiment is a magnetoresistive random access memory (MRAM) device including a bottom electrode, the bottom electrode connected by a bottom electrode via to a metal feature of an underlying substrate. The MRAM device also includes a magnetic tunnel junction (MTJ) disposed over the bottom electrode and a top electrode disposed over the MTJ, the top electrode including a material having an oxidation temperature greater than 450° C. at 10 seconds or less.

Another embodiment is a magnetoresistive random access memory (MRAM) cell including a top electrode, the top electrode including a film of titanium nitride, the top electrode including a crystal orientation (111) as a dominant crystal orientation concentration. The magnetoresistive random access memory also includes a magnetic tunnel junction (MTJ) disposed under the top electrode. The magnetoresistive random access memory also includes a bottom electrode disposed under the MTJ.

Another embodiment is a magnetoresistive random access memory (MRAM) device including a bottom electrode, the bottom electrode connected by a bottom electrode via to a metal feature of an underlying substrate. The magnetoresistive random access memory also includes a magnetic tunnel junction (MTJ) disposed over the bottom electrode. The magnetoresistive random access memory also includes a top electrode disposed over the MTJ, the top electrode including a material having a tensile stress greater than 400 Mpa.

Another embodiment is a device including a bottom electrode over a via, the via electrically coupling the bottom electrode to a control line for a magnetoresistive random access memory (MRAM) device. The device also includes a magnetic tunnel junction (MTJ) over the bottom electrode. The device also includes a top electrode over the MTJ, a material of the top electrode including a first conductive material and a first dopant, the first dopant including carbon, silicon, or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive random access memory (MRAM) cell comprising:
   a substrate;
   a bottom electrode over the substrate;
   a magnetic tunnel junction (MTJ) over the bottom electrode; and
   a top electrode over the MTJ, the top electrode being a single layer of titanium nitride directly contacting the MTJ, the top electrode having a crystal orientation (111) as a dominant crystal orientation concentration.

2. The MRAM cell of claim 1, wherein the MTJ comprises:
   an anti-ferromagnetic layer over and coupled to the bottom electrode;
   a pinning layer over the anti-ferromagnetic layer; and
   a free layer over the pinning layer.

3. The MRAM cell of claim 2, wherein the MTJ further comprises:
   a tunnel barrier layer between the anti-ferromagnetic layer and the pinning layer.

4. The MRAM cell of claim 2, wherein the MTJ further comprises:
   a tunnel barrier layer between the pinning layer and the free layer.

5. The MRAM cell of claim 1, wherein the single layer of titanium nitride is doped with a dopant.

6. The MRAM cell of claim 5, wherein the dopant is silicon or carbon.

7. The MRAM cell of claim 6, wherein a dopant concentration of the dopant in the single layer is in a range of $1.0 \times 10^{22}$ cm$^{-3}$ to $1.0 \times 10^{24}$ cm$^{-3}$.

8. The MRAM cell of claim 1, wherein the top electrode has a tensile stress greater than 400 Mpa.

9. A magnetoresistive random access memory (MRAM) device comprising:

a first electrode;
a second electrode being a single layer of titanium nitride doped with silicon, the second electrode having a crystal orientation (111) as a dominant crystal orientation concentration; and
a magnetic tunnel junction (MTJ) between the first electrode and the second electrode.

10. The MRAM device of claim 9, wherein the first electrode is disposed over a plurality of active devices, wherein the second electrode is disposed over the first electrode.

11. The MRAM device of claim 9, wherein the second electrode has a tensile stress greater than 400 Mpa.

12. The MRAM device of claim 9, wherein the MTJ comprises:
   an anti-ferromagnetic layer coupled to the first electrode;
   a pinning layer over the anti-ferromagnetic layer; and
   a free layer over the pinning layer.

13. The MRAM device of claim 9, further comprising:
   a protective dielectric layer disposed on sidewalls of the MTJ and sidewalls of the second electrode.

14. The MRAM device of claim 13, wherein a top surface of the second electrode extends above a top surface of the protective dielectric layer.

15. The MRAM device of claim 9, wherein the second electrode has a convex top surface.

16. A device comprising:
   a bottom electrode over a via, the via electrically coupling the bottom electrode to an active device;
   a magnetic tunnel junction (MTJ) over the bottom electrode; and
   a top electrode over the MTJ, the top electrode being a single layer of titanium nitride, the top electrode having a crystal orientation (111) as a dominant crystal orientation concentration, and the top electrode having a tensile stress greater than 400 Mpa.

17. The device of claim 16, wherein the single layer of titanium nitride is doped with silicon or carbon.

18. The device of claim 17, wherein a dopant concentration of the silicon or the carbon in the single layer is in a range of $1.0 \times 10^{22}$ cm$^{-3}$ to $1.0 \times 10^{24}$ cm$^{-3}$.

19. The device of claim 16, wherein the bottom electrode comprises:
   a first metal layer; and
   a second metal layer over the first metal layer, the second metal layer being made of a different material than the first metal layer.

20. The device of claim 16, wherein a resistance across the MTJ is between 190Ω and 200Ω when the MTJ has a first spin orientation, and wherein the resistance across the MTJ is between 250Ω and 285Ω when the MTJ has a second spin orientation opposite the first spin orientation.

* * * * *